United States Patent
Wan et al.

(12) 
(10) Patent No.: US 6,579,420 B2
(45) Date of Patent: Jun. 17, 2003

(54) APPARATUS AND METHOD FOR UNIFORMLY DEPOSITING THIN FILMS OVER SUBSTRATES

(75) Inventors: Zhimin Wan, Sunnyvale, CA (US); Jiong Chen, San Jose, CA (US); Peiching Ling, San Jose, CA (US); Jianmin Qiao, Fremont, CA (US)

(73) Assignee: Advanced Optical Solutions, Inc., Sunnyvale, CA (US)

( * ) Notice: Subject to any disclaimer, the term of this patent is extended or adjusted under 35 U.S.C. 154(b) by 0 days.

(21) Appl. No.: 09/780,212

(22) Filed: Feb. 9, 2001

(65) Prior Publication Data
US 2002/0134668 A1 Sep. 26, 2002

(51) Int. Cl.[7] .......................... C23C 16/00; C23C 14/46
(52) U.S. Cl. ............................. 204/192.11; 204/192.12; 204/298.04; 204/298.11; 204/298.23; 204/298.27; 204/298.28; 204/298.29; 427/523; 427/526; 118/729; 118/730
(58) Field of Search ................ 204/192.11, 192.12, 204/298.04, 298.11, 298.23, 298.27, 298.28, 298.29; 427/523, 526; 118/729, 730

(56) References Cited

U.S. PATENT DOCUMENTS 6,338,775 B1 * 1/2002 Chen ..................... 204/298.11

* cited by examiner

Primary Examiner—Rodney G. McDonald
(74) Attorney, Agent, or Firm—Bo-In Lin

(57) ABSTRACT

A thin film deposition apparatus and method are disclosed in this invention. The apparatus includes a depositing thin-film particle source, a beam-defining aperture between the particle source and the deposited substrate(s), and a substrate holder to rotate the substrate(s) around its center and move the center along a lateral path so that the substrate(s) can scan across the particle beam from one substrate edge to the other edge. The method includes a step of providing a vacuum chamber for containing a thin-film particle source for generating thin-film particles to deposit a thin-film on the substrates. The method further includes a step of containing a substrate holder in the vacuum chamber for holding a plurality of substrates having a thin-film deposition surface of each substrate facing the beam of thin-film particles. The method further includes a step of providing a rotational means for rotating the substrate holder to rotate each of the substrates exposed to the thin-film particles for depositing a thin film thereon. And, the method further includes a step of providing a laterally reciprocal moving means for reciprocally moving said substrate holder for said beam traversing on said substrate holder from one side of the edge to the other side of the edge or at least passing through the central area of said substrate holder.

27 Claims, 5 Drawing Sheets

APPARATUS AND METHOD FOR UNIFORMLY DEPOSITING THIN FILMS OVER SUBSTRATES

BACKGROUND OF THE INVENTION

1. Field of the Invention

The invention disclosed herein relates generally to method and apparatus for material processing for thin film deposition or ion implantation applying beam-scanning technologies. More particularly, this invention relates to an improved scanning apparatus and method applied to highly uniform thin film depositions on substrates with materials sputtered from targets by collisions with energetic ion beams. The same method can be applied to other processes that need high uniformity, such as ion implantation, magnetic device manufacturing.

2. Descriptions of the Prior Art

Difficulties due to stringent uniformity requirements for advanced technology development have been encountered by those of ordinary skill in the art for applying conventional apparatuses and methods to carry out the tasks of deposition or implantation processes on substrates. These processes may also include thin film depositions for fabricating a DWDM (Dense Wavelength Division Multiplexing) filter. A specific difficulty is to deposit a thin film for manufacturing a narrow band optical filter that requires thin films with highly uniform thickness. Even though the uniformity of thin-film thickness is very critical for the narrow band optical filter, a high degree of thin-film uniformity is not easily achievable. The difficulty of unable to provide thin film with required uniformity causes low deposition yield and high manufacturing cost. New DWDM technology development demands to further reduce the bandwidth of filters for increasing the data transmitting capacity. This trends to drive more stringent requirements in thickness uniformity for achieving new filter performance and maintaining the fabrication yield. For example, the wavelength bandwidth of a 100 GHz DWDM filter is about 0.8 nm, and a 0.05% of thickness non-uniformity is required for fabricating 100 GHz filters in the area. A further reduction of the wavelength bandwidth to 0.4 nm for 50 GHz filters will require a non-uniformity of 0.02% for a DWDM filter. Many methods and apparatuses have been employed to increase the uniformity in the processes of optical coatings, ion implantation, and other applications.

A typical sputtering deposition system for the optical coatings contains a vacuum chamber where target materials are impacted by ion beams or heated by electron beams to sputter or evaporate the target materials off the targets. The materials from the targets are deposited onto substrates to form thin films. The conventional apparatus can be applied to thin film deposition on a single substrate or multiple substrates. A typical single substrate deposition system has a rotational carrier to rotate the single substrate around the substrate center axis while the target materials are sputtering onto the surface of the substrate to form the thin films. In a multiple substrate deposition system, substrates are mounted on a common rotational carrier that rotates around a central axis. Each substrate may or may not rotate along its central axis in order to increase the film deposition uniformity. In the conventional methods, the in-situ measurement of the deposition thickness is performed on a fixed radius of the rotating substrate. The high uniformity area of the rotating substrate is usually located at the fixed radius in a ring since the particle beam flux seldom changes at the fixed radius during one substrate rotation period. The width of the uniform ring depends on the size of the incident sputtered particle beam and particle beam flux distribution within the beam. Since the particle beam distribution varies over time and the deposition time is usually as long as one or two days, it is difficult to maintain the uniform deposition over a large area.

Apparatus of thickness control by introducing additional linear transverse movement to the rotation substrates in optical coating systems is disclosed in U.S. Pat. No. 5,879,519. A similar approach in ion implantation is disclosed in U.S. Pat. No. 3,778,626 in 1972. In U.S. Pat. No. 5,879,519 the magnetron deposition devices are adapted for relative movement generally transverse to the axis of rotation of the substrate carrier disk at a velocity proportional to the radial position. In this approach, the deposited area on substrates would be increased in a comparison of deposition with stationary source(s). However, this method cannot provide good thickness uniformity on the substrates because the radial transverse velocity should be inversely proportional to the radial position as disclosed in U.S. Pat. No. 3,778,626. However, the approach disclosed in U.S. Pat. No. 3,778,626 imposes three stringent requirements on deposition systems. Specifically, these requirements are 1) relative transverse movement between the deposition source and substrate has to be along radial direction with very small deviation allowed, 2) highly symmetric source particle flux profile, and 3) the distance between the carry disk center and the symmetric axis of the deposition particle flux must be very accurately determined. Also, the tolerances of these aspects are much tighter as the diameter of the carrying disk is decreased. These requirements impose tremendous practical difficulties in obtaining the deposition non-uniformity below 0.05%.

In a conventional ion implantation technology, a typical ion implanter is used which contains a vacuum chamber where an ion beam is generated. The ion beam impacts on a batch of wafers. In the batch system, a disk holds several wafers on its periphery. The disk rotates about its center axis. The ion beam scans along transverse direction to the disk surface at a velocity inversely proportional to the distance of the center of the disk to the beam spot. Therefore, since the wafer holder is rotating at a high speed, the ion beam was supposed to scan uniformly over annular areas with a same beam scan radius. The details of this operation are disclosed in U.S. Pat. No. 3,778,626. The approach would improve the implant non-uniformity down to 1%. However, it is difficult for further improvement of uniformity with this approach. First, the beam scan velocity is hard to be determined since distance of the disk center to the reference point of the beam spot is difficult to be practically determined. Secondly, the ion concentration profile within the source beam is normally asymmetric. A radial scan of an asymmetric ion beam still limits the achievement of a high degree of process uniformity.

For other process technologies in semiconductor and magnetic data storage device manufacturing, such as physical vapor deposition, chemical vapor deposition, reactive ion etching, electroplating, the controllable process non-uniformity is above 2%. The processes offered by these techniques are not able to meet the thickness uniformity requirements for making the narrow band optical filters.

For the above reasons, as more stringent requirements for advanced optical filters are imposed on the thickness-uniformity, the conventional methods of deposition are often unable to satisfy a reduced tolerance limit of the film-thickness variances. Furthermore, a technique to monitor and control the deposition process to achieve a predefined requirement of thickness uniformity is not available. The state of the art in film deposition technology thus limits a person of ordinary skill in the art to achieve higher thickness uniformity when systems and methods currently available are applied to carry out the thin-film deposition processes.

Therefore, a need still exists in the art of process technology to provide a new and improved apparatus and method for improving the process uniformity.

SUMMARY OF THE PRESENT INVENTION

It is the object of the present invention to provide a new system configuration and method for carrying out a process by monitoring and more precisely controlling the motion of the substrate(s) for process uniformity improvement. Specifically, it is the object of the present invention to present a new system configuration of thin film deposition by moving the substrate(s) in rotational and laterally reciprocated movements. The range of the lateral movement covers from one side of the substrate holder edge to at least passing the substrate holder center or to the other side of the substrate holder. The velocity of the lateral movement is inversely proportional to the distance from a reference point at or near the center of the substrate holder to any reference point near the particle source beam spot (preferably the center of the beam). With the new and improved system configuration and method of operations, the difficulties of the prior art systems and methods are resolved. More uniform thin films can be produced for optical filter manufacturing, IC (Integrated Circuit) device manufacturing, and other process manufacturing requiring high uniformity over the substrate surfaces.

A process apparatus and control method of beam scanning for achieving a very high degree of uniformity over a substrate surface are disclosed in this invention. The method includes a step of providing a vacuum chamber for containing a mechanism of generating a particle source either for thin-film deposition or other surface modification processes such as ion implantation on a single substrate or multiple substrates. The method further includes a step of containing a substrate holder (or disk) that rotates at a high speed about its center axis in the vacuum chamber. The disk holds a substrate or multiple substrates having the substrate surface (s) facing the particle source. And, the method further includes a step of providing a laterally reciprocated moving means for laterally moving the substrate holder and controlling the velocity of the lateral movement for controlling a process uniformity of said process on the substrate(s). The laterally reciprocated movement of a substrate holder can be preferably achieved by either a linear transverse motion or by a swing motion along an arc trace, or by a trace with a controllable mechanism. The velocity of the lateral movement of the substrate holder is inversely proportional to the distance between the rotation center of the substrate holder and any reference point within a projection volume generated by the particle source beam. The preferable reference point is within a cross sectional area defined by the projection volume of the particle source beam intersected by the substrate holder. The range of the lateral movement can cover at least one half of the area of the substrate holder extended from an edge to any point passing through the center of the holder, preferably from one edge to an opposite edge of the substrate holder.

A preferred embodiment of this invention discloses a thin film deposition apparatus for performing a thin-film deposition on a substrate or multiple substrates mounted on a substrate holder. The apparatus includes a vacuum chamber containing a thin-film particle source or multiple sources for generating thin-film particles to deposit a thin-film or multiple layers of thin films on the substrate(s). The apparatus further includes a substrate holder disposed in the vacuum chamber for holding the substrate(s) having a thin-film depositing surface facing the thin-film particle sources. The apparatus further includes a rotational means for rotating the substrate holder to rotate the substrate exposed to the thin-film particles for depositing a thin film thereon. The apparatus further includes a lateral moving means for laterally transversely moving or swinging the rotating substrate holder and controlling the velocity of the lateral movement inversely proportional to the distance from the rotating center of the substrate holder to a reference point in the projection area of some particle beam on the substrate surface moving plane. The extent of the lateral movement is wide enough so that the source beam can relatively scan from one side of the substrate holder to the other side.

These and other objects and advantages of the present invention will no doubt become obvious to those of ordinary skill in the art after having read the following detailed descriptions of the preferred embodiment that is illustrated in the various drawing figures.

DETAILED DESCRIPTION OF THE METHOD

Figure 1:
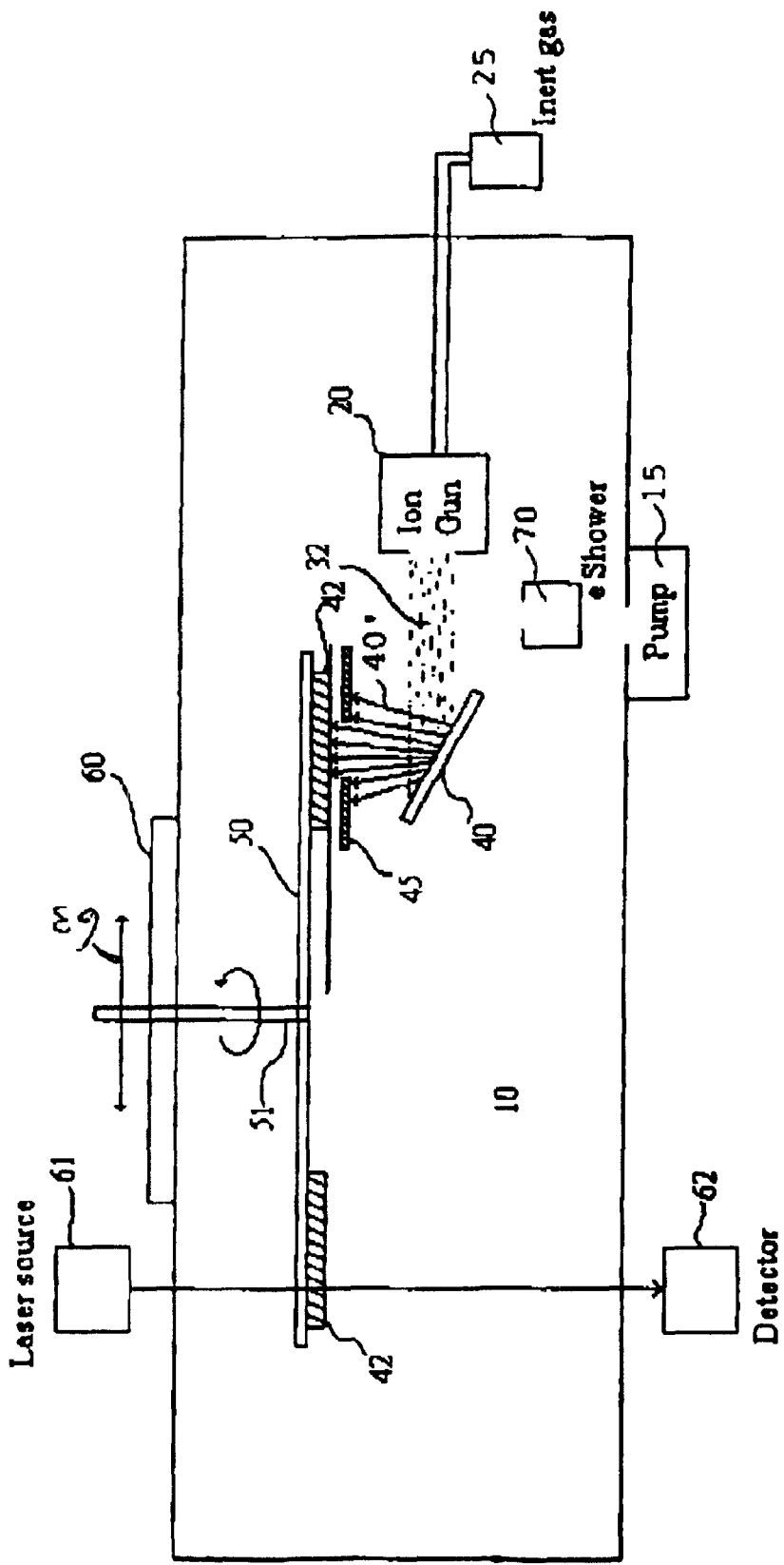
FIG. 1 is a functional block diagram of a thin-film deposition system of this invention.

The present invention teaches a novel and improved thin-film deposition apparatus and method by applying combined rotational-and-lateral movements with extended lateral motion range and controllable speed to improve the uniformity of the thin-film thickness. FIG. 1 is a diagram for illustrating the system configuration for carrying out a thin-film deposition process provided with capabilities to control the uniformity of thin-film thickness. A vacuum chamber 10 for containing the thin-film deposition system is evacuated to a low air pressure by applying a vacuum pump 15. The ion guns 20 disposed inside the vacuum chamber 10 are supplied with a specific gas, e.g. inert gas, from a gas source 25 to produce a positively charged ion beam 32. The targets 40 employed for thin film deposition are held at an acute angle to the ion beam 32. The ion beam impinges onto the targets 40 made of a thin-film deposition material for sputtering particles off from the targets 40 with the particles projected to the direction shown as arrows in FIG. 1. The particles 40 sputtered off from the targets 40 are directed toward a mask or aperture 45, which defines the particle stream shape before the particles reaching the substrate 42. The disk 50, which carries substrate 42, rotates along a rotational axial shaft 51 at a high speed. The axial shaft 51 attached securely to the rotation disk 50 is fastened to a vacuum-sealed slider 60 and the vacuum-sealed slider 60 is controlled to move along lateral directions as by the arrows 63. An optical monitoring system that includes a laser source 61 and a detector 62 are employed to measure the film thickness deposited on the substrate 42. As the ion beam 32 is positively charged, an electron shower 70 is applied to generate low energy electrons to neutralize the space charges induced by the ion beam 32 floating in the space inside the vacuum chamber 10 as positively charged particles.

Figure 2:
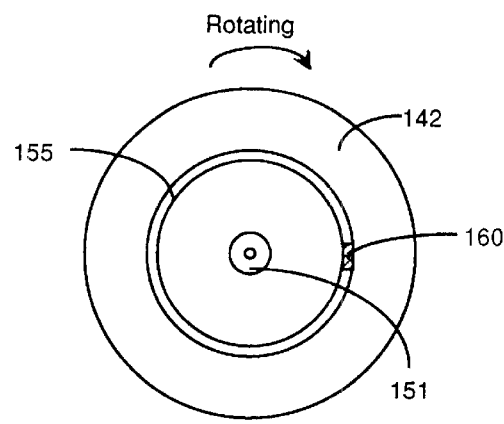
FIG. 2 is a deposition annular ring on a single substrate with rotating motion of the substrate.

When a single substrate 142 as that shown in FIG. 2 is loaded for the deposition, the substrate is mounted at the center 151 of the substrate holder (not shown). The substrate holder is rotating at a high speed of approximately 100 rpm to 10,000 rpm depending on the lateral speed to ensure the circular and spiral traces of particles deposited on the substrate caused by rotational and lateral motions overlapping each other to increase deposition uniformity. Films are depositing on the substrate with a shape like an annular ring 155. The ring 155 has a same radial width equal to the beam width along the lateral motion direction. Therefore, the beam projected from the beam aperture 160 has a cross sectional area on the substrate as a rectangle or a square shape or a circular shape with diameter same as the beam if the beam has a round shape, as shown in FIG. 2. As a lateral motion is imposed on the substrate holder starting from the center of the holder towards to the edge, the deposition film spirally grows on the substrate. For the purpose of achieving a uniform deposition, the depositing area in a unit time, which is equal to a product of lateral motion velocity and substrate rotation speed, should be a constant, i.e.

$$V_1 * \omega L = \text{constant.} \quad (1)$$

where $V_1$ is the velocity of lateral motion perpendicular to the rotation speed direction, $\omega$ is the rotating speed of the substrate holder, and L is the distance between the center A of the substrate holder and a reference point O in the source beam as that shown and described in FIG. 3 below. The Eq. (1) can be rewritten as $$V_1 = dL/dt = \kappa/L \quad (2)$$

where $\kappa$ is a constant.

Under the situation that the lateral movement of the rotation center A of the substrate holder is controlled to have a swing motion speed following Eq. (2), as that shown in FIG. 3, an improved deposition uniformity on the substrate can be demonstrated by following theoretical analyses.

In a x-y coordinate system, the coordinate's origin O is disposed near the beam shown as an aperture P that may have different shapes projected onto the substrate with a distance L between O and A. The distance between the arc motion center B and the substrate holder rotation center A is R. Referring to FIG. 3, the center B of the arc motion of the substrate-center is located at B(O, R). The substrate center A will pass through the origin O when the substrate is rotated along a circular arc centered at B. During the time as the center A is swinging from left to right, the substrate ring with an inner radius $r_1$ and an outer radius $r_2$ scans through the beam aperture P for exposing the ring to the beam particles. For the purpose of achieving a uniform beam exposure over the substrate ring, the speed of substrate lateral motion according to the disclosure of this invention is precisely controlled. The speed of substrate lateral motion is controlled to be inversely proportional to distance L, as shown in Equation (2). In this case, $$L = 2R \sin(\theta/2) \quad (3)$$

where $\theta$ is the angle between the line AB and the y-axis, Equation (2) becomes $$d\theta/dt = \kappa/(R^2 \sin \theta). \quad (4)$$

It can be demonstrated that the total beam particle exposure, or ultimately the deposited thickness, is the same at any point on the substrate when the scanning angular speed, $d\theta/dt$, varies according to Equation (4). The uniformity is achieved when $\omega r >> R d\theta/dt$, where r is the distance between a substrate point S and the substrate center A (r1<r<r2) and the substrate ring completely scans through the beam aperture P from left to the right or vise versa.

During the substrate scanning process, a point S designated by its coordinates (x, y) on the substrate passes through the particle beam many times when the point rotates around the slowly moving substrate center, i.e. $\omega r >> R d\theta/dt$. The thickness, T(S), near the point S(x,y) on the substrate is proportional to the total particle number accepted by a unit area near each point S(x,y), $$T(S) = \sum_i I(x_i, y_i) \Delta t_i, \quad (5)$$

where $I(x_i, y_i)$ is the beam particle density at a point C with coordinate $(x_i, y_i)$, $\Delta t_i$ is the time of the substrate point S(x,y) spent inside a small area $\Delta x \Delta y$ near $(x_i, y_i)$ and the summation covers the whole beam area. It can be proved that when the substrate scans through the beam with its center on the left side of the beam and $\omega r >> R d\theta/dt$ with r, the distance between S and A, $\Delta t_i$ can be expressed as:

$$\Delta t_i = \Delta x \Delta y / (2\pi R r \sin \beta d\theta/dt), \quad (6)$$

where $\beta$ is the angle between line AB and AC. If $d\theta/dt$ changes according to Equation (4), Equation (6) becomes, $$\Delta t_i = \Delta x \Delta y R \sin\theta / (2\pi \kappa r \sin \beta). \quad (7)$$

And, Equation (5) becomes an integral when $\Delta x \to 0$ and $\Delta y \to 0$, $$T(S) = \int \frac{I(x, y) R \sin\theta \, dx \, dy}{2\pi \kappa r \sin\beta}. \quad (8)$$

Since both $\theta$ and $\beta$ are the functions of r, x, and y, T(S) in Equation (8) is a function of r. It means that a unit area at a different location of the substrate with different r would have a different deposition thickness.

Figure 3:
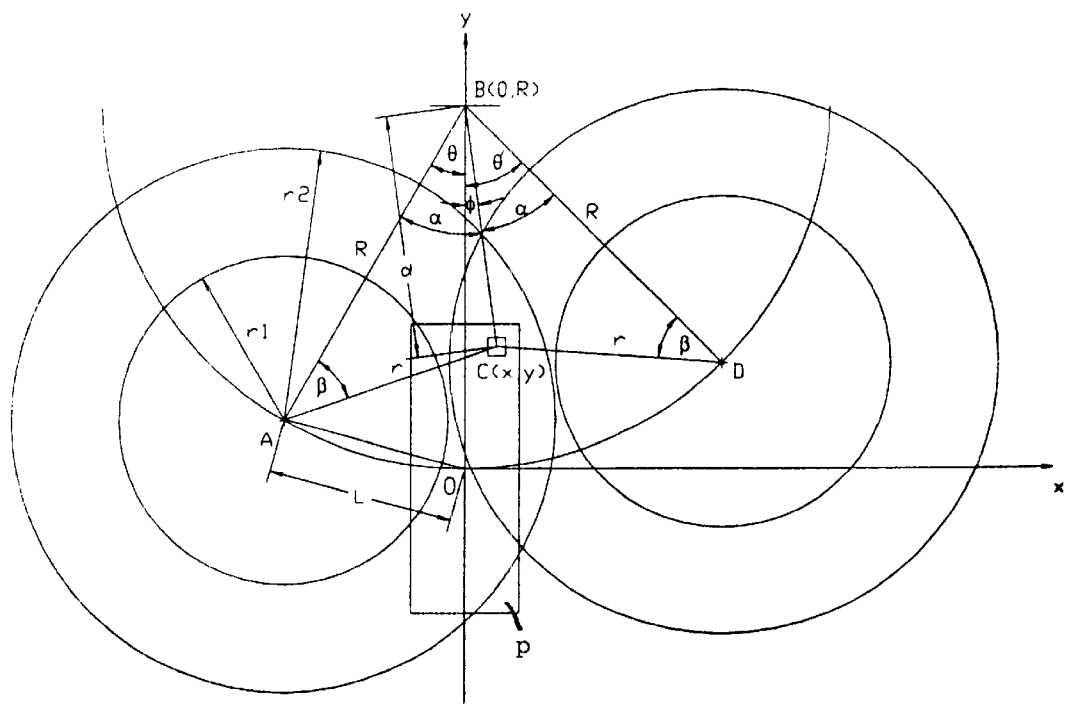
FIG. 3 is a top view of a single substrate with a swing movement.

When the substrate also scans through the beam with its center on the right side of the beam as shown as dotted lines in FIG. 3, the point S on the substrate can passes through the point C in the beam again with the substrate center at the point D as shown in FIG. 3. Similarly, the time $\Delta t_i'$ of the point S spent inside the small area $\Delta x \Delta y$ is $$\Delta t_i' = \Delta x \Delta y R \sin \theta' / (2\pi \kappa r \sin\beta), \quad (9)$$

where θ' is the angle between the line DB and the y-axis. Combine Equations (7) and (9), the total time Δt of the point S spent inside area ΔxΔy is:

$$\Delta t = \Delta x \Delta y R(\sin\theta + \sin\theta')/(2\pi\kappa r \sin\beta). \quad (10)$$

Considering θ=α−φ, θ'α+φ, and the triangle law $$\sin\beta/d = \sin\alpha/r, \text{ or } r\sin\beta = d\sin\alpha, \quad (11)$$

where α is the angle between line AB and BC, φ is the angle between line BC and the y-axis, and d is the distance between B and C, Δt can be expressed as $$\Delta t = \Delta x \Delta y R[\sin(\alpha-\phi)+\sin(\alpha+\phi)]/(2\pi\kappa d \sin\alpha) \quad (12)$$

$$= \Delta x \Delta y R \cos\phi/(\pi\kappa d)$$

Since $d^2=(x^2+(R-y)^2)$ and $\cos\phi=(R-y)/d$, when $\Delta x \to 0$ and $\Delta y \to 0$, Eq(5) becomes $$T(S) = \int \frac{I(x,y)R(R-y)dxdy}{\pi\kappa(x^2+(R-y)^2)}. \quad (13)$$

The right side of Equation (13) is no longer the function of r, which means that T(S) is the same for all points on the substrate.

Under the situation that the substrate moves along a line instead of an arc, the linear speed should be controlled according to Equation (2) and T(S) can be obtained by letting $R \to \infty$ in Equation (13), $$T(S) = \int \frac{I(x,y)dxdy}{\pi\kappa} = I_{beam}/\pi\kappa, \quad (14)$$

where $I_{beam}$ is the total beam particle numbers per unit time passing through the aperture.

Figure 4:
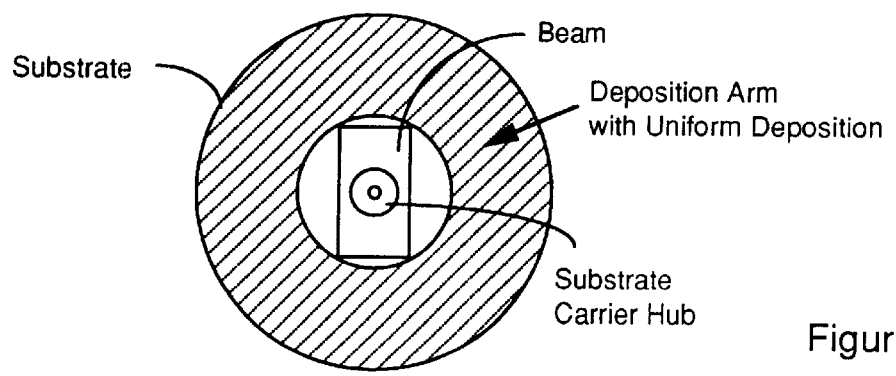
FIG. 4 is a top view of a substrate holder showing a center area where has a limited improvement of process uniformity.
Figure 5:
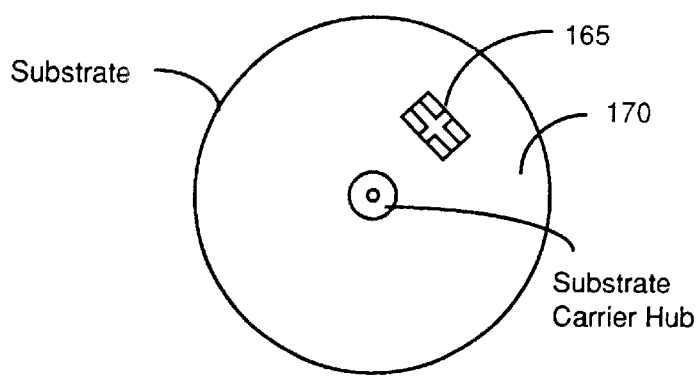
FIG. 5 is a top view of a substrate holder with multiple beam apertures.
Figure 6:
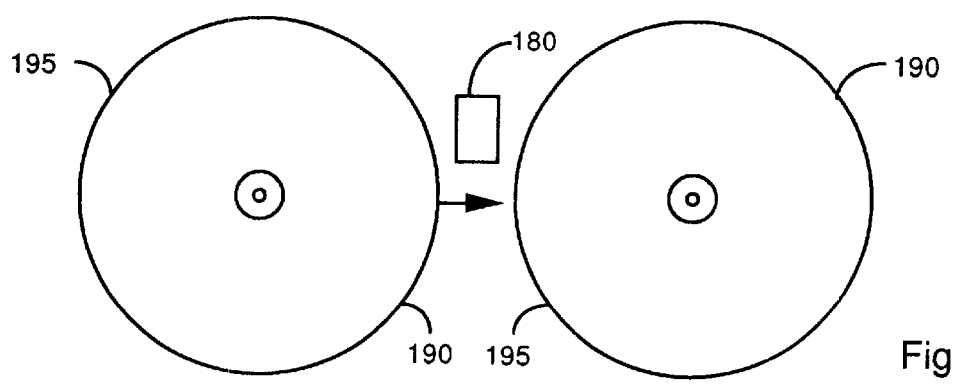
FIG. 6 is a top view of a single substrate with a lateral movement along a one-dimensional axis. The lateral motion axis is not passing through the center of the rotating substrate.

It is to be noted that the advantage of beam scanning uniformity achieved by the variable lateral speed scanning is extended over a circular ring area surrounding a central circle with a specific diameter. Referring to FIG. 4, this specific diameter of the central circle is equal to the diagonal distance of a rectangle or square corresponding to the shape of the beam aperture projected onto the substrate. On the other hand, if the beam is projected through a circular aperture, the diameter of the central circle surrounded by the circular-ring of uniform scanning is equal to the beam diameter of the circle projected onto the substrate or substrate holder as again shown in FIG. 4. Referring to FIG. 5 for a substrate scanned with multiple beam apertures. An outline area 165, which covers all these apertures, will be equivalent to a single aperture. Therefore, a uniform beam scanning can also be achieved for the area 170 on the substrate other than the outlined area 165 shown in FIG. 5 by using a multiple aperture system while controlling a substrate or substrate holder to have a variable lateral speed of movement as described above.

Based on above descriptions this invention discloses a method for performing a lateral motion of the substrate holder or a beam scanning operation to expose a surface area of the substrate to an aperture of a source beam. The method includes steps of a) providing a vacuum chamber for containing a source target for generating a plurality of particles for projecting through the aperture; b) containing a substrate holder in the vacuum chamber for holding a substrate having a surface facing toward the aperture; c) providing a rotational means for rotating the substrate holder to rotate the substrate for scanning through the aperture for exposing the surface to the beam; and d) controlling a lateral swing or linear transverse means to rotate or to move the substrate holder from one side of the substrate to the other side of the substrate with variable speeds for uniformly exposing the surface of the substrate to the aperture. In a preferred embodiment, the step of controlling the swing means is a method of controlling the swing means to rotate at a swing speed inversely proportional to a distance between the center of the substrate and any reference point approaching the aperture. In another preferred embodiment, the step of controlling the transverse motion means is a method of controlling the transverse motion means to move at a transverse speed inversely proportional to a distance between the center of the substrate and a reference point approaching the aperture.

Based on the above descriptions, this invention discloses an apparatus for performing a thin film deposition on multiple substrates. The apparatus includes a vacuum chamber for containing a thin-film particle source for generating thin-film particles to deposit thin-films on the substrates. The apparatus further includes a substrate holder in the vacuum chamber for holding the substrates, each having a thin-film deposition surface facing a beam of the thin-film particles projected from the thin-film particle source. The apparatus further includes a rotational means for rotating the substrate holder holding the substrates to rotate along an axis at an angle, preferably perpendicular, to the surfaces of the substrates that exposes to the thin-film particles for depositing thin films on the thin-film deposition surfaces of the substrates. The apparatus further includes a laterally reciprocal moving means for reciprocally moving the substrate holder holding the substrates to move along a direction at an angle, preferably perpendicular, to the beam of the thin-film particles whereby the beam traversing on the substrate holder from a first edge of the substrate holder to a second edge opposite the first edge of the substrate holder with a non-linear varying traversing velocity relative to the beam of the thin film particles. In a preferred embodiment, the substrate holder has a conical shape for holding the substrates in place by a centrifugal force. In another preferred embodiment, the substrate holder has at least one placement means for placing and holding a substrate of circular shape. In another preferred embodiment, the substrate holder has at least one placement means for placing and holding a substrate of square shape.

Figure 7:
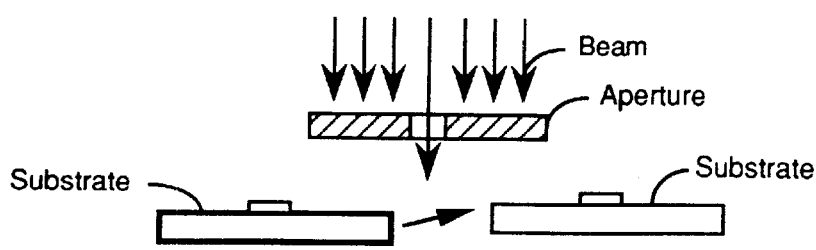
FIG. 7 illustrates the lateral motion direction inclined with the substrate rotation plane.

FIG. 7 is cross sectional view for showing a configuration for performing a beam scanning with ion beam 310 that is projected through a scanning aperture 320 onto a rotating substrate 330 rotating along an axis Y0 not parallel to the projection direction of the scanning beam 310. The substrate 330 is also making a lateral movement transversal to the rotational motion of the substrate passing through an area below the aperture 320. According to FIG. 7, the lateral motion of the substrate 330 is along a direction J, and the direction J is at an angle, preferably perpendicular, to the rotational axis Y0. The lateral movement of the substrate 330 is not parallel to the plane of rotation of the substrate. According to above equations and discussion, a uniform beam scanning can be achieved without requiring the substrate 330 to move laterally along the rotational plane. Therefore, by controlling the lateral movement speed and range as described above, a highly uniform beam scanning operation can be achieved even the substrate is moving along a lateral direction with a small incline angle relative the rotation plane of the substrate. The method as disclosed in this invention thus provide significant flexibility in controlling the lateral movement with requiring the substrate 330 to move precisely along the rotational plane.

Figure 8:
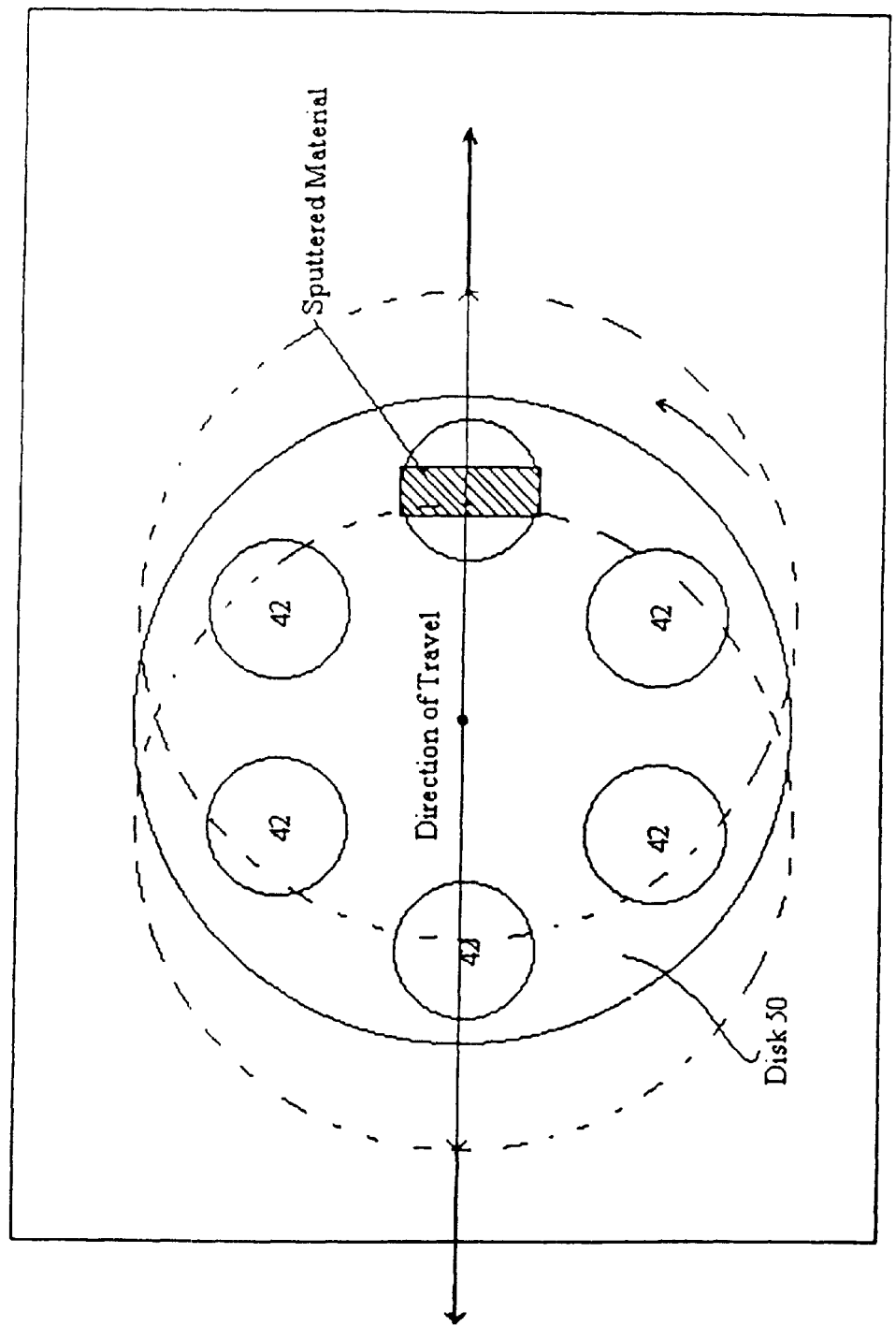
FIG. 8 is a top view of a substrate holder with multiple substrates placing on the holder and moving laterally along a one-dimensional axis.

For a batch process system with multiple substrates placed on the substrate holder, similar to a single substrate system the substrate holder is also rotating along the center of the holder. FIG. 8 shows a top view of the disk 50 that holds several substrates 42 for a batch system. The disk 50 is controlled to rotate along the axial shaft 51 in FIG. 1 and also to move the substrates 42 laterally in and out of the beam of the sputtered particles 40'. Depending on the distance of the center of the substrate holder and the position of the source beam, the velocity of the lateral motion of the substrate holder is controlled inversely proportional to the distance from a center of the substrate holder 50 to a center point of the aperture. The range of the lateral movement should cover from the most left side of a substrate to the most right side of another substrate in order to obtain the best uniformity.

Figure 9:
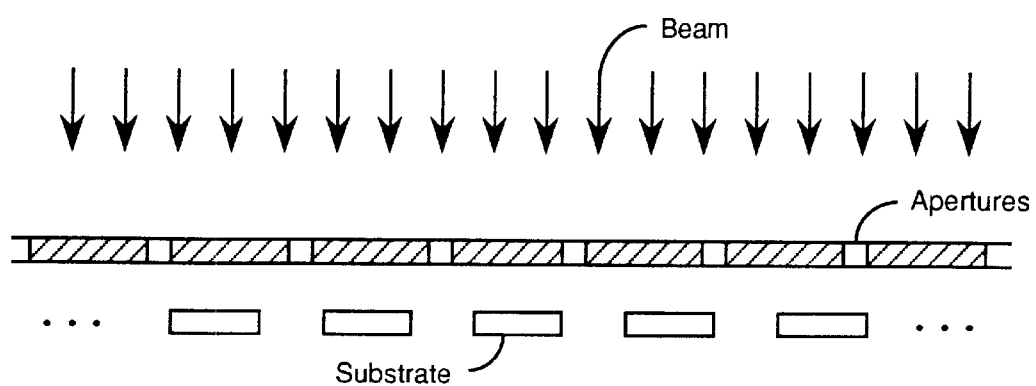
FIG. 9 is a top view of a substrate holder with multiple substrates and multiple beam apertures. A lateral transverse motion is also imposed on the substrate holder.

The present invention can also be applied to a deposition system of multiple individual substrate holder with multiple beam apertures. FIG. 9 shows an embodiment of a batch system with dispersed source materials, such as an evaporation system. In this system, one or more substrate holders may be used with one or more substrates and beam apertures for each holder. Each substrate holder is rotating independent along its own axis. For this case, each substrate holder can be considered as an individual single beam source and substrate process system. Therefore, the same method can be applied for uniformity improvements.

Therefore, the present invention provides a new system configuration and method for carrying out the thin film deposition process by monitoring and controlling the lateral motion with a velocity inversely proportional to the distance between the center of the substrate holder and the beam position on the substrates for thin film deposition. It is critically important that the range of this lateral motion of the substrate is required for an equivalent source beam scanning from one edge to the other edge of the substrate. By moving the substrates in rotational and lateral movements and by controlling the speed of the lateral movement and its range, high uniformity of thin-film thickness is achieved. With the new and improved system configuration and method of operations, the difficulties of the prior art systems and methods are resolved. More uniform thin films are now available to provide better and more reliable optical devices and devices of other applications which require a high surface process uniformity.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An apparatus for performing a thin film deposition on a substrate comprising:
   a vacuum chamber containing a thin-film particle source for generating thin-film particles to deposit a thin-film on said substrate;
   a substrate holder disposed in said vacuum chamber for holding said substrate having a thin-film deposition surface facing a beam of said thin-film particles projected from said thin-film particle source;
   a rotational means for rotating said substrate holder holding said substrate to rotate along an axis at an angle about ninety degrees relative to said thin-film deposition; and
   a laterally reciprocal moving means for reciprocally moving said substrate holder for holding said substrate along a direction with said beam traversing on said substrate from a first edge of said substrate to a second edge opposite said first edge of said substrate with a lateral motion traversing said beam of said thin film particles with a non-constant speed.

2. The apparatus of claim 1 wherein:
   said laterally reciprocal moving means further comprises a substrate holder control means for controlling said lateral motion of said substrate holder with a non-constant speed to be linearly and inversely proportional to a distance of a rotating center of said substrate to a fixed point on a moving plane of said substrate at or at a short distance from said beam of said thin-film particles.

3. The apparatus of claim 1 wherein:
   said laterally reciprocal moving means further comprises a means for actuating a laterally swing movement for reciprocally moving said substrate holder following an arc trace with said lateral motion traversing said beam of said thin film particles with said non-constant speed.

4. The apparatus of claim 1 wherein:
   said laterally reciprocal moving means further comprises a means for actuating a laterally straight movement for reciprocally moving said substrate holder following a straight line trace with said lateral motion traversing said beam of said thin film particles with said non-constant speed.

5. The apparatus of claim 1 further comprising:
   a mask disposed in front of said thin film particle source having at least one opening-window to define a shape of said beam of said thin-film particles projected onto said substrate.

6. An apparatus for performing a thin film deposition on multiple substrates comprising:
   a vacuum chamber for containing a thin-film particle source for generating thin-film particles to deposit thin-films on said substrates;
   a substrate holder in said vacuum chamber for holding said substrates, each having a thin-film deposition surface facing a beam of said thin-film particles projected from said thin-film particle source;
   a rotational means for rotating said substrate holder holding said substrates to rotate along an axis at an angle about ninety degrees relative to the surfaces of said substrates exposed to said thin-film particles for depositing thin films on said thin-film deposition surfaces of said substrates; and
   a laterally reciprocal moving means for reciprocally moving said substrate holder holding said substrates to move along a direction at an angle about ninety degrees relative to said beam of said thin-film particles whereby said beam traversing on said substrate holder from a first edge of said substrate holder to a second edge opposite said first edge of said substrate holder with a lateral motion traversing said beam of said thin film particles with a non-constant speed.

7. The apparatus of claim 6 wherein:
   a mask disposed in front of said thin-film particle source with at least one opening-window to define a shape of said beam of said thin-film particles projected on each of said substrates;
   said laterally reciprocal moving means further comprising a substrate holder control means for controlling said lateral motion of said substrate holder holding said substrates with a non-constant speed to be inversely proportional to a distance of a rotating center of said substrate holder to a fixed point on a substrate holder moving plane at or disposed at short distance from said beam of said thin-film particles.

8. The apparatus of claim 6 wherein:
said laterally reciprocal moving means further comprising a varying traversing velocity moving means for reciprocally moving said substrate holder following an arc trace with a lateral motion traversing said beam of said thin film particles with a non-constant speed.

9. The apparatus of claim 6 wherein:
said laterally reciprocal moving means further comprising a varying traversing velocity moving means for reciprocally moving said substrate holder following a straight line trace with a lateral motion traversing said beam of said thin film particles with a non-constant speed.

10. The apparatus of claim 6 wherein:
said substrate holder has a conical shape for holding said substrates in place by a centrifugal force.

11. The apparatus of claim 6 wherein:
said substrate holder has at least one placement means for placing and holding a substrate of circular shape.

12. The apparatus of claim 6 wherein:
said substrate holder has at least one placement means for placing and holding a substrate of square shape.

13. The apparatus of claim 6 wherein:
said substrate holder has at least one placement means for placing and holding a substrate of rectangular shape.

14. The apparatus of claim 6 further comprising:
an electron shower disposed in said vacuum chamber to generate electrons for neutralizing space charges generated by said thin-film particle source.

15. A method for performing a thin film deposition on one or multiple substrates comprising:
providing a vacuum chamber for containing a thin-film particle source for generating thin-film particles to deposit thin-films on said substrates;
containing a substrate holder in said vacuum chamber for holding said substrates having thin-film deposition surfaces facing a beam of said thin-film particles projected from said thin-film particle source;
providing a rotational means for rotating said substrate holder to rotate all substrates along an axis at an angle about ninety degrees relative to the surfaces of said substrates that exposes to said thin-film particles for depositing thin films thereon; and
providing a laterally reciprocal moving means for reciprocally moving said substrate holder holding said substrates to move along a direction at an angle about ninety degrees relative to said beam of said thin-film particles for said beam traversing on said substrate holder from one side of the edge to the other side of the edge or at least passing through the central area of said substrate holder with a lateral motion traversing said beam of said thin film particles with a non-constant speed.

16. The method of claim 15 further comprising:
disposing a mask in front of said thin film particle source with one or more openings to define the shape of said source beam on each substrate;

controlling said lateral motion of said substrate holder to be inversely proportional to a distance of a center of said substrate holder to a fixed point disposed at or disposed at a short distance from said beam projected from said particle source.

17. The method of claim 15 further comprising:
reciprocally moving said substrate holder following an arc trace with a lateral motion traversing said beam of said thin film particles with a non-constant speed.

18. The method of claim 15 further comprising:
reciprocally moving said substrate holder following an straight trace with a lateral motion traversing said beam of said thin film particles with a non-constant speed.

19. The method of claim 15 further comprising:
bombarding a thin-film target with an ion beam for knocking off said thin film particles from said thin-film target for generating said thin-film particles to deposit a thin-film on said substrates.

20. The method of claim 19 further comprising:
employing an ion gun for projecting said ion beam to said thin-film target.

21. The method of claim 20 further comprising:
providing an inert gas to said ion gun for generating said ion beam.

22. The method of claim 15 wherein:
said step of providing a vacuum chamber for containing a thin-film particle source further comprising a step of providing a vacuum chamber with a vacuum in the range of $10^{-5}$ Torr in said vacuum chamber.

23. The method of claim 15 wherein:
said step of providing a vacuum chamber for containing a thin-film particle source for generating thin-film particles to deposit thin-films on said substrates further comprising a step of containing a thin-film particle source for generating surface processing particles.

24. A method for performing ion implantation on one or multiple wafers comprising:
providing a vacuum chamber for containing an ion source for generating implant particles to be implanted into said wafers;
containing a wafer holder in said vacuum chamber for holding said wafers having implantation surfaces facing a beam of said implant particles projected from said ion source;
providing a rotational means for rotating said wafer holder to rotate all wafers along an axis at an angle about ninety degrees relative to the surfaces of said wafers that exposes to said implant particles for implantation thereon; and
providing a laterally reciprocal moving means for reciprocally moving said wafer holder holding said wafers to move along a direction at an angle about ninety degrees relative to said beam of said implant particles for said beam traversing on said wafer holder from one side of the edge to the other side of the edge or at least passing through the central area of said wafer holder with a lateral motion traversing said beam of said thin film particles with a non-constant speed.

25. The method of claim 24 wherein:

disposing a mask in front of said thin-film particle source with one or more openings to define the shape of said source beam on each wafer;

said step of reciprocally moving said wafer holder to move said wafers further comprises a step of controlling said lateral motion of said substrate holder to be inversely proportional to a distance of a center of said wafer holder to a fixed location at or disposed at a short distance from said beam projected from said particle source.

26. The method of claim 25 further comprising:

reciprocally moving said wafer holder following an arc trace with a lateral motion traversing said beam of said thin film particles with a non-constant speed.

27. The method of claim 24 further comprising:

reciprocally moving said wafer holder following an straight trace with a lateral motion traversing said beam of said thin film particles with a non-constant speed.

* * * * *